US009773766B2

(12) United States Patent
Ye et al.

(10) Patent No.: US 9,773,766 B2
(45) Date of Patent: Sep. 26, 2017

(54) SEMICONDUCTOR DEVICE INCLUDING INDEPENDENT FILM LAYER FOR EMBEDDING AND/OR SPACING SEMICONDUCTOR DIE

(71) Applicants: SANDISK SEMICONDUCTOR (SHANGHAI) CO., LTD., Shanghai (CN); SANDISK INFORMATION TECHNOLOGY (SHANGHAI) CO., LTD., Shanghai (CN)

(72) Inventors: Ning Ye, San Jose, CA (US); Chin-Tien Chiu, Taichung (TW); Suresh Upadhyayula, San Jose, CA (US); Peng Fu, Kunshan (CN); Zhong Lu, Shanghai (CN); Cheeman Yu, Fremont, CA (US); Yuang Zhang, Shanghai (CN); Li Wang, Shanghai (CN); Pradeep Kumar Rai, Shanghai (CN); Weili Wang, Shanghai (CN); Enyong Tai, Shanghai (CN); King Hoo Ong, Shanghai (CN); Kim Lee Bock, Shanghai (CN)

(73) Assignees: SanDisk Information Technology (Shanghai) Co., Ltd., Shanghai (CN); SanDisk Semiconductor (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 14/422,152

(22) PCT Filed: Jan. 9, 2013

(86) PCT No.: PCT/CN2013/070264
§ 371 (c)(1),
(2) Date: Feb. 17, 2015

(87) PCT Pub. No.: WO2014/107848
PCT Pub. Date: Jul. 17, 2014

(65) Prior Publication Data
US 2015/0221624 A1    Aug. 6, 2015

(51) Int. Cl.
*H01L 23/00* (2006.01)
*H01L 25/00* (2006.01)
(Continued)

(52) U.S. Cl.
CPC ............ *H01L 25/18* (2013.01); *H01L 23/145* (2013.01); *H01L 23/5389* (2013.01);
(Continued)

(58) Field of Classification Search
CPC ......... H01L 25/00; H01L 25/18; H01L 25/50; H01L 25/165; H01L 25/062;
(Continued)

(56) References Cited

U.S. PATENT DOCUMENTS 6,339,255 B1    1/2002  Shin
6,946,323 B1    9/2005  Heo
(Continued)

FOREIGN PATENT DOCUMENTS

CN    101026148    8/2007
CN    101281612    10/2008
(Continued)

OTHER PUBLICATIONS

Office Action dated May 18, 2015 in Tawian Patent Application No. 102139867.
(Continued)

*Primary Examiner* — Jasmine Clark
(74) *Attorney, Agent, or Firm* — Vierra Magen Marcus LLP

(57)    ABSTRACT

A semiconductor package including a plurality of stacked semiconductor die, and methods of forming the semicon-
(Continued)

ductor package, are disclosed. In order to ease wirebonding requirements on the controller die, the controller die may be mounted directly to the substrate in a flip chip arrangement requiring no wire bonds or footprint outside of the controller die. Thereafter, a spacer layer may be affixed to the substrate around the controller die to provide a level surface on which to mount one or more flash memory die. The spacer layer may be provided in a variety of different configurations.

20 Claims, 9 Drawing Sheets

(51) Int. Cl.
*H01L 25/16* (2006.01)
*H01L 25/18* (2006.01)
*H01L 23/14* (2006.01)
*H01L 23/538* (2006.01)
H01L 23/31 (2006.01)

(52) U.S. Cl.
CPC .............. *H01L 24/27* (2013.01); *H01L 24/32* (2013.01); *H01L 24/49* (2013.01); *H01L 24/743* (2013.01); *H01L 24/83* (2013.01); *H01L 24/92* (2013.01); *H01L 25/00* (2013.01); *H01L 25/165* (2013.01); *H01L 25/50* (2013.01); *H01L 23/3128* (2013.01); *H01L 23/3135* (2013.01); *H01L 24/29* (2013.01); *H01L 24/48* (2013.01); *H01L 24/73* (2013.01); *H01L 24/85* (2013.01); *H01L 2224/05554* (2013.01); *H01L 2224/2732* (2013.01); *H01L 2224/27318* (2013.01); *H01L 2224/27848* (2013.01); *H01L 2224/2919* (2013.01); *H01L 2224/32145* (2013.01); *H01L 2224/32225* (2013.01); *H01L 2224/32265* (2013.01); *H01L 2224/48091* (2013.01); *H01L 2224/48225* (2013.01); *H01L 2224/48227* (2013.01); *H01L 2224/48228* (2013.01); *H01L 2224/49175* (2013.01); *H01L 2224/49433* (2013.01); *H01L 2224/73265* (2013.01); *H01L 2224/8385* (2013.01); *H01L 2224/83191* (2013.01); *H01L 2224/83855* (2013.01); *H01L 2224/83856* (2013.01); *H01L 2224/83986* (2013.01); *H01L 2224/85986* (2013.01); *H01L 2224/92247* (2013.01); *H01L 2225/06562* (2013.01); *H01L 2924/00014* (2013.01); *H01L 2924/0665* (2013.01); *H01L 2924/1205* (2013.01); *H01L 2924/1206* (2013.01); *H01L 2924/1207* (2013.01); *H01L 2924/12042* (2013.01); *H01L 2924/143* (2013.01); *H01L 2924/1438* (2013.01); *H01L 2924/15311* (2013.01); *H01L 2924/181* (2013.01); *H01L 2924/19103* (2013.01); *H01L 2924/19105* (2013.01)

(58) Field of Classification Search
CPC ..... H01L 2225/03; H01L 24/49; H01L 24/83; H01L 23/5389; H01L 2224/32145; H01L 2224/48091; H01L 2224/48227; H01L 2224/49174; H01L 2224/73265; H01L 2924/19105; H01L 2224/48228; H01L 2224/2919; H01L 2224/83191; H01L 2224/83855; H01L 2224/06562; H01L 23/3128; H01L 23/3135; H01L 24/73; H01L 2224/48195; H01L 2224/97; H01L 25/105; H01L 2924/14; H01L 2924/181; H01L 25/0657; H01L 2224/48145; H01L 2224/83856; H01L 2924/1438; H01L 2225/0651; H01L 2924/0665; H01L 24/32; H01L 2924/00011
See application file for complete search history.

(56) References Cited

U.S. PATENT DOCUMENTS

| | | | |
|---|---|---|---|
| 7,391,118 B2* | 6/2008 | Tsai | H01L 25/16 257/777 |
| 7,550,834 B2 | 6/2009 | Yu et al. | |
| 8,633,578 B2* | 1/2014 | Camacho | H01L 22/32 257/686 |
| 8,664,780 B2* | 3/2014 | Han | H01L 23/3135 257/678 |
| 2005/0212131 A1* | 9/2005 | Kawai | G06K 19/0775 257/737 |
| 2007/0045876 A1 | 3/2007 | Onodera et al. | |
| 2007/0284716 A1 | 12/2007 | Vindasius et al. | |
| 2009/0026630 A1 | 1/2009 | Ozawa et al. | |
| 2010/0007001 A1* | 1/2010 | Wang | H01L 23/481 257/686 |
| 2010/0027233 A1 | 2/2010 | Low et al. | |
| 2011/0115100 A1 | 5/2011 | Okumura et al. | |
| 2011/0140258 A1* | 6/2011 | Do | H01L 21/56 257/686 |
| 2011/0254144 A1 | 10/2011 | Lee et al. | |
| 2012/0235188 A1* | 9/2012 | Phang | H01L 33/508 257/98 |
| 2012/0319263 A1 | 12/2012 | Cho et al. | |

FOREIGN PATENT DOCUMENTS

| | | |
|---|---|---|
| CN | 101292352 | 10/2008 |
| CN | 102163595 | 8/2011 |
| JP | 2009088217 | 4/2009 |
| JP | 2012129464 | 7/2012 |
| KR | 20050122482 | 12/2005 |
| KR | 20090021452 | 3/2009 |
| KR | 20110024538 | 3/2011 |
| TW | 200721471 | 6/2007 |
| TW | 200836306 | 9/2008 |

OTHER PUBLICATIONS

International Search Report and Written Opinion dated Oct. 17, 2015 in International Patent Application No. PCT/CN2013/070264.
Response to Office Action filed Aug. 21, 2015 in Taiwan Patent Application No. 102139869, and partial English translation.
Response to Office Action filed Jul. 21, 2016 in Taiwan Patent Application No. 102139867.
Office Action dated Jul. 11, 2016 in Korean Patent Application No. 10-2015-7007500.
English language Abstract for JP2009088217 published Apr. 23, 2009.
English language Abstract for JP2012129464 published Jul. 5, 2012.
English language Abstract for KR20050122482 published Dec. 29, 2005.
English language Abstract for KR20110024538 published Mar. 9, 2011.
Response to Office Action filed Nov. 11, 2016 in Korean Patent Application No. 10-2015-7007500.
Office Action dated Dec. 20, 2016 in Chinese Patent Application No. 201380052391.5.
English language Abstract for CN101292352 published Oct. 22, 2008.
Office Action dated Mar. 28, 2017 in Korean Patent Application No. 10-2015-7007500.
Machine Translation for KR 20090021452 published Mar. 4, 2009.
Response to Office Action filed Jun. 13, 2017 in Korean Patent Application No. 10-2015-7007500.
Response to Office Action filed May 12, 2017 and English translation of claims as amended therein, in Chinese Patent Application No. 201380052391.5.

* cited by examiner

US 9,773,766 B2

1

SEMICONDUCTOR DEVICE INCLUDING INDEPENDENT FILM LAYER FOR EMBEDDING AND/OR SPACING SEMICONDUCTOR DIE

BACKGROUND OF THE INVENTION

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

A cross-sectional side view and a top view of a conventional semiconductor package 20 are shown in FIGS. 1 and 2 (without molding compound in FIG. 2). Typical packages include a plurality of semiconductor die, such as flash memory die 22 and controller die 24, affixed to a substrate 26. A plurality of die bond pads 28 may be formed on the semiconductor die 22, 24 during the die fabrication process. Similarly, a plurality of contact pads 30 may be formed on the substrate 26. Die 22 may be affixed to the substrate 26, and then die 24 may be mounted on die 22. All die may then be electrically coupled to the substrate by affixing wire bonds 32 between respective die bond pad 28 and contact pad 30 pairs. Once all electrical connections are made, the die and wire bonds may be encapsulated in a molding compound 34 to seal the package and protect the die and wire bonds.

In order to most efficiently use package footprint, it is known to stack semiconductor die on top of each other, either completely overlapping each other, or with an offset as shown in FIGS. 1 and 2. In an offset configuration, a die is stacked on top of another die so that the bond pads of the lower die are left exposed. An offset configuration provides an advantage of convenient access of the bond pads on each of the semiconductor die in the stack.

In order to increase memory capacity in semiconductor packages while maintaining or reducing the overall size of the package, the size of the memory die has become large compared to the overall size of the package. As such, it is common for the footprint of the memory die to be almost as large as the footprint of the substrate. Space within the semiconductor package for wirebonding down to the substrate is therefore at a premium. In particular, where there are multiple stacked flash memory die 22, it may become difficult to find space on the substrate for all of the contact pads required to make all of the necessary electrical connections. The number of die bond pads, contact pads and

2 wire bonds in an actual semiconductor package would be many more than is shown in FIGS. 1 and 2. The number shown in FIGS. 1 and 2 is greatly reduced for the sake of clarity. Moreover, FIGS. 1 and 2 include only a pair of memory die 22. There may be more than that in the die stack, making it even harder to find room for all of the required wire bonds.

The controller die 24 is generally smaller than the memory die 22. Accordingly, the controller die 24 is conventionally placed at the top of the memory die stack. However, where there is a plurality of stacked memory die already bonded to the substrate, it is often difficult to find space on the substrate for all of the required controller die wire bonds. Moreover, there is a desire to increase the speed with which semiconductor devices operate, even as the number of memory die within a semiconductor device increases. Given these factors, some semiconductor packages are manufactured with the controller die bonded directly to the substrate.

In order to thereafter bond the memory die on top of the controller, the bottom memory die is provided with a layer of liquid adhesive. The bottom die is applied on top of the controller die so that the controller die and wire bonds embed within the layer of liquid adhesive. Thereafter, the liquid adhesive layer is cured.

This operation has certain drawbacks. For example, the liquid adhesive tends to bleed to an upper surface of the bottom memory die, where it can contaminate the die bond pads and prevent proper wire bonding to the substrate. Moreover, typically additional memory die are added on top of the bottom die to form a stack of memory die. Another problem with conventional designs is that the bottom die (with liquid adhesive) is attached at a first station, and then the package is moved to a second station, where the remaining die in the stack are mounted (using a die attach adhesive). Further problems include movement of the bottom memory die before liquid adhesive is cured, damage to the controller die or wire bonds upon embedding within the liquid adhesive, and damage to the bottom memory die upon cure and thermal mismatch between the liquid adhesive and bottom memory die.

DETAILED DESCRIPTION

Figure 1:
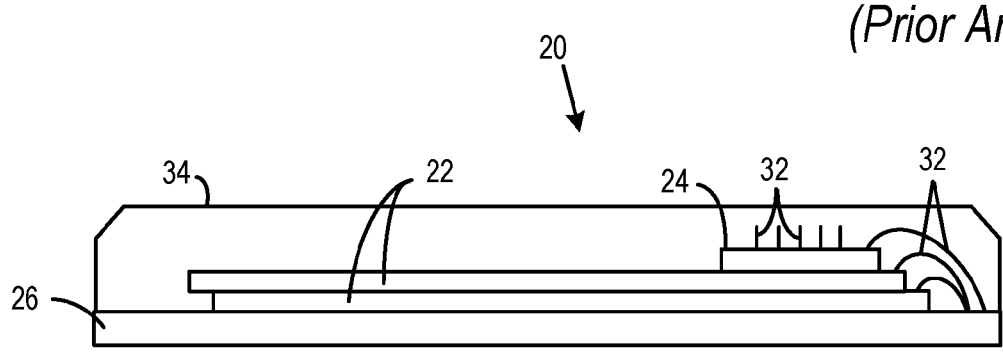
FIG. 1 is a cross-sectional side view of a conventional semiconductor package.
Figure 2:
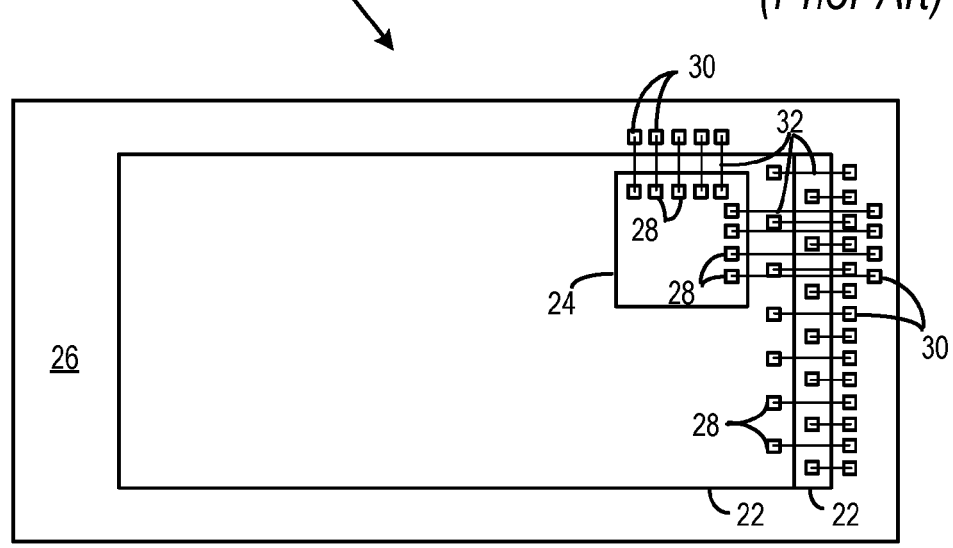
FIG. 2 is a top view of a conventional substrate and wire bonded semiconductor die.

The present technology will now be described with reference to FIGS. 3 through 16, which in embodiments, relate to a semiconductor device including a film layer applied independently to the substrate for embedding a surface mounted controller die and/or passive components, or for spacing a memory die stack from a surface mounted controller die and/or passive components. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal" as may be used herein are by way of example and illustrative purposes only, and are not meant to limit the description of the invention inasmuch as the referenced item can be exchanged in position and orientation.

An embodiment of the present invention will now be explained with reference to the flowchart of FIG. 3 and the top and side views of FIGS. 4 through 16. Although FIGS. 4 through 16 each show an individual device 100, or a portion thereof, it is understood that the device 100 may be batch processed along with a plurality of other packages 100 on a substrate panel to achieve economies of scale. The number of rows and columns of packages 100 on the substrate panel may vary.

The substrate panel begins with a plurality of substrates 102 (again, one such substrate is shown in FIGS. 4 through 16). The substrate 102 may be a variety of different chip carrier mediums, including a printed circuit board(PCB), a leadframe or a tape automated bonded (TAB) tape. Where substrate 102 is a PCB, the substrate may be formed of a core 103 having a top conductive layer 105 and a bottom conductive layer 107. The core 103 may be formed of various dielectric materials such as for example, polyimide laminates, epoxy resins including FR4 and FR5, bismaleimidetriazine (BT), and the like. Although not critical to the present invention, the core may have a thickness of between 40 microns (μm) to 200 μm, although the thickness of the core may vary outside of that range in alternative embodiments. The core 103 may be ceramic or organic in alternative embodiments.

The conductive layers 105, 107 surrounding the core may be formed of copper or copper alloys, plated copper or plated copper alloys, Alloy 42 (42Fe/58Ni), copper plated steel, or other metals and materials known for use on substrate panels. The conductive layers may have a thickness of about 10 μm to 25 μm, although the thickness of the layers may vary outside of that range in alternative embodiments.

Figure 3:
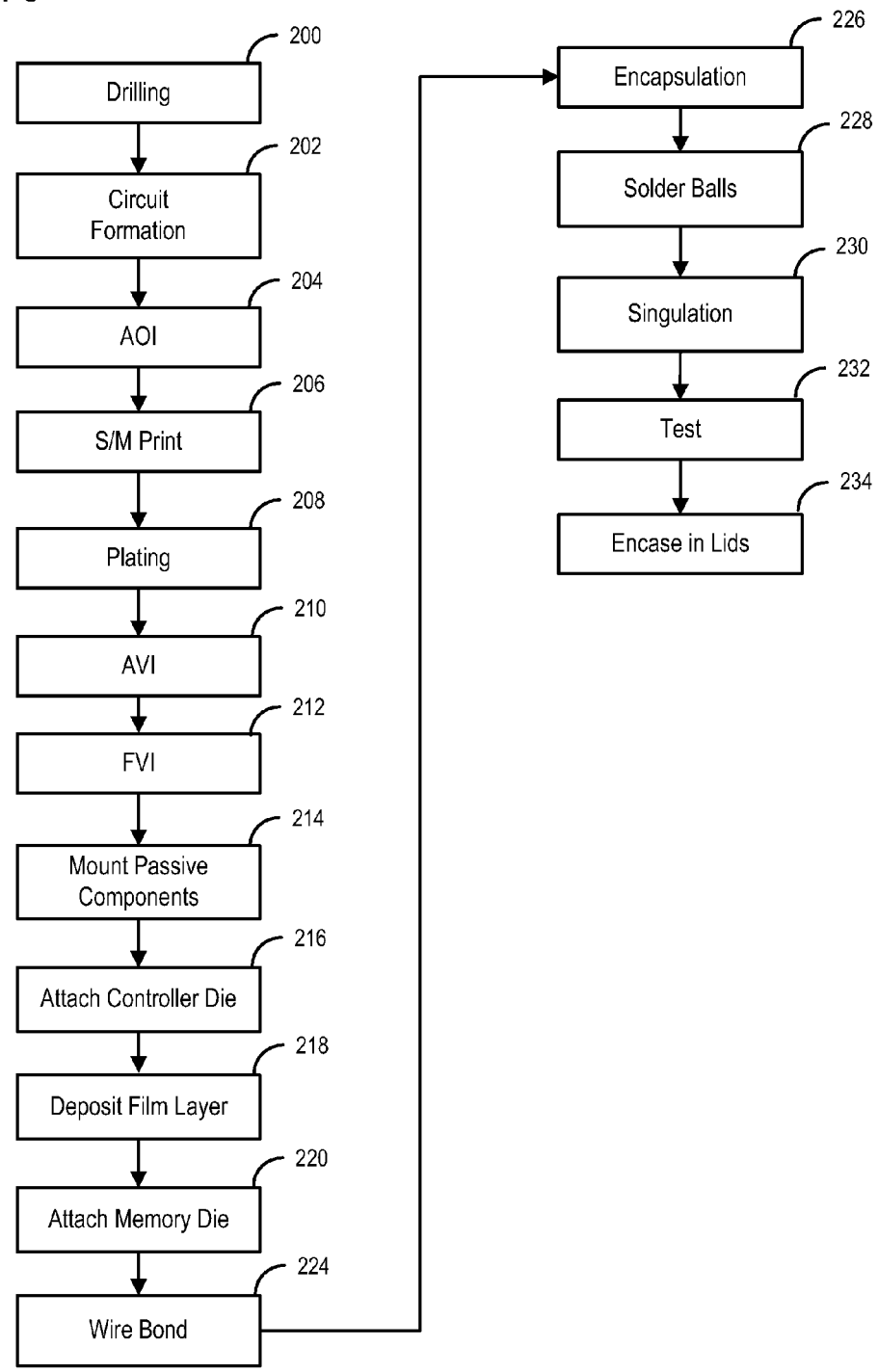
FIG. 3 is a flowchart of the overall fabrication process of semiconductor device according to embodiments of the present invention.
Figure 4:
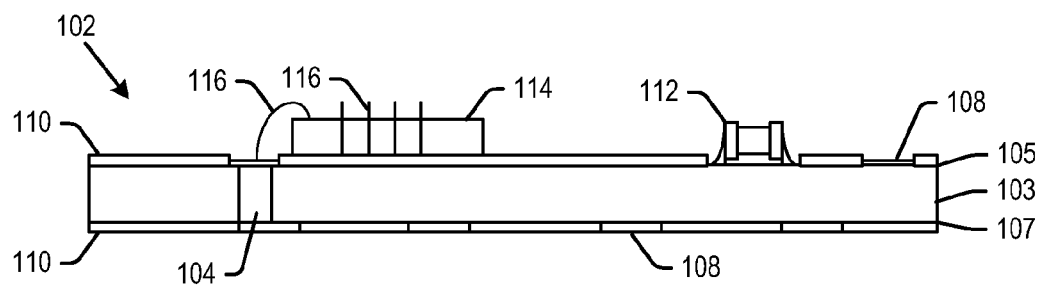
FIG. 4 is a side view of a semiconductor device at a first step in the fabrication process including a controller die surface mounted to a substrate in an embodiment of the present technology.
Figure 5:
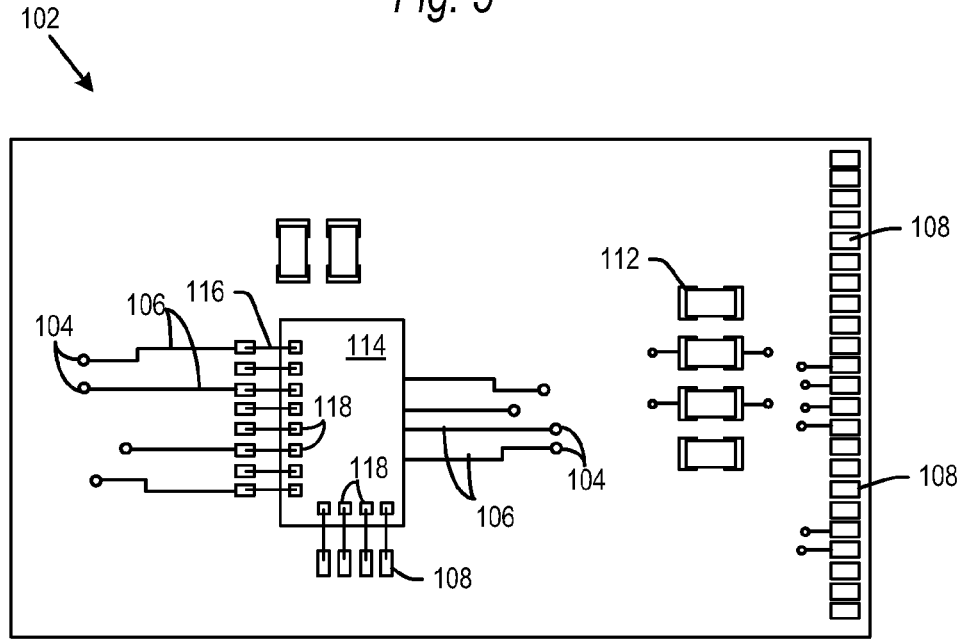
FIG. 5 is a top view of the semiconductor device shown in FIG. 4.
Figure 6:
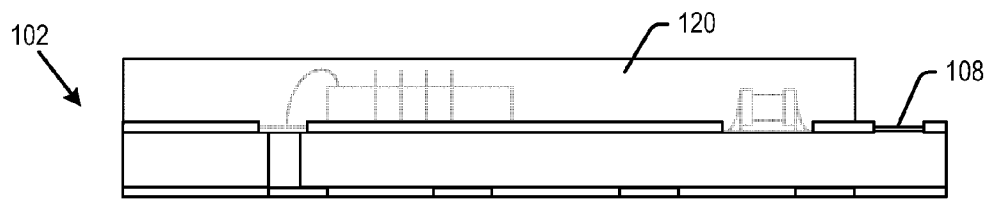
FIG. 6 is a side view of a semiconductor device at a second step in the fabrication process including a film layer formed on the substrate in an embodiment of the present technology.

FIG. 3 is a flowchart of the fabrication process for forming a semiconductor device according to embodiments of the present invention. In a step 200, the substrate 102 is drilled to define through-hole vias 104 in the substrate 102. The vias 104 (only some of which are numbered in the figures) shown are by way of example, and the substrate may include many more vias 104 than is shown in the figures, and they may be in different locations than is shown in the figures. Conductance patterns are next formed on one or both of the top and bottom conductive layers in step 202. The conductance pattern(s) may include electrical traces 106 and contact pads 108. The traces 106 and contact pads 108 (only some of which are numbered in the figures) shown are by way of example, and the substrate 102 may include more traces and/or contact pads than is shown in the figures, and they may be in different locations than is shown in the figures.

In embodiments, the finished semiconductor device 100 assembly may be used as a BGA package. A lower surface of the substrate 102 may include contact pads 108 for receiving solder balls as explained below. In further embodiments, the finished semiconductor device 100 may be an LGA package including contact fingers for removably coupling the finished device 100 within a host device. In such embodiments, the lower surface may include contact fingers instead of the contact pads that receive solder balls. The conductance pattern on the top and/or bottom surfaces of the substrate 102 may be formed by a variety of known processes, including for example various photolithographic processes.

Referring again to FIG. 3, the substrate 102 may then be inspected in an automatic optical inspection (AOI) in step 204. Once inspected, a solder mask 110 may be applied to the substrate in step 206. After the solder mask is applied, the contact pads, contact fingers and any other solder areas on the conductance patterns may be plated with a Ni/Au, Alloy 42 or the like in step 208 in a known electroplating or thin film deposition process. The substrate 102 may then be inspected and tested in an automated inspection process (step 210) and in a final visual inspection (step 212) to check electrical operation, and for contamination, scratches and discoloration. Assuming the substrate 102 passes inspection, passive components 112 may next be affixed to the substrate in a step 214. The one or more passive components may include for example one or more capacitors, resistors and/or inductors, though other components are contemplated. The passive components 112 (only some of which are numbered in the figures) shown are by way of example only, and the number, type and position may vary in further embodiments.

A controller die 114, such as for example an ASIC, may next be affixed and electrically coupled to the substrate 102 in step 216. Die bond pads 118 on an upper surface of the controller die 114 may be electrically coupled to contact pads 108 via wire bonds 116. Only some of the wire bonds 116 and die bond pads 118 are numbered and shown. The wire bonding process may be a known process such as a reverse ball bond process, though other wire bonding processes are contemplated. In further embodiments, the controller 114 may be mounted to contacts 108 in a flip chip process, in which case the wire bonds 116 may be omitted.

Figure 7:
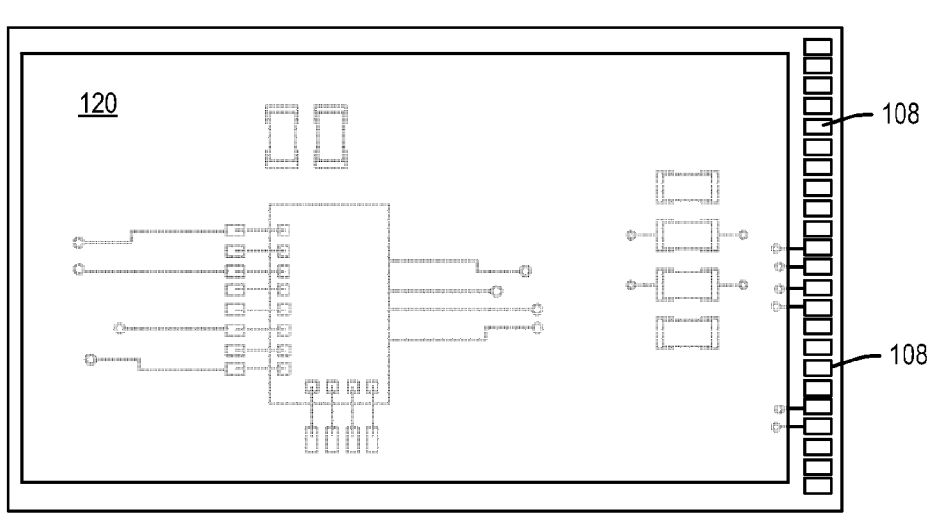
FIG. 7 is a top view of the semiconductor device shown in FIG. 6.

Referring now to the side view of FIG. 7, a film layer may be formed on substrate 102 in step 218. In conventional designs, a liquid adhesive is applied to a bottom memory die, and the memory die is then mounted on the substrate, so that the wire bonded controller die embeds within the liquid adhesive. As described in the Background section, this approach has problems, including bleed of the liquid adhesive to an upper side of the memory die, and damage to the controller die and/or controller die wire bonds upon lowering the memory die and liquid adhesive onto the controller die and wire bonds.

These drawbacks are solved by the present technology, which in embodiments deposits a film layer 120 on the substrate in a step 218, completely embedding the controller die 114, wire bonds 116 and passive components 112. The film layer 120 may be applied by itself (not on a bottom surface of a memory die). An example of the film layer 120 on substrate 102 is shown in the side view of FIG. 6 and the top view of FIG. 7.

In embodiments, the film layer 120 may be an epoxy which, in examples has properties including low bleed, non-voiding, low internal stress, low warpage, and electrically non-conductive. Examples of such film layers include 6202C epoxy from Henkel AG & Co. KGaA having a corporate headquarters in Dusseldorf, Germany. Other epoxies may be used in alternative embodiments, including for example YizBond® BS1001 epoxy from YizTech, Co., Ltd. of Taiwan, and AHS-996E epoxy from 3M Company having a corporate headquarters in St. Paul, Minn., USA. It is understood that other epoxies, and SMT adhesives other than epoxies, may be used for film layer 120 in further embodiments.

In examples, the film layer 120 may be printed directly to the surface of substrate 102, on top of the solder mask layer 110 and controller die 114 as an A-stage liquid or low viscosity paste. A thin film printer such as a Horizon 02i printer from DEK International of Dorset, England may be used, though other printers may be used for applying film layer 120 in further embodiments.

In one example, a stencil may be positioned on a panel of substrates 102, and the liquid or paste may be printed onto the substrate on top of the stencil. The stencil has apertures in positions and shape that align over the controller die 114. Thus, when the A-stage epoxy is applied to the surface, the epoxy is screened from all portions of the substrate panel except where the apertures are. The result is that the A-stage film layer 120 is applied over the controller die 114, in the shape shown for example in FIG. 7. The shape and position of the layer 120 on the substrate 102 may be provided to match the shape and position of the bottom die to be mounted on substrate 102 as explained hereinafter. However, the stencil may have apertures in other shapes to form the film layer 120 in other shapes in further embodiments, as is also explained hereinafter. The film layer 120 may be applied without use of a stencil in further embodiments.

One example of a suitable stencil is an electroformed (eformed) stencil, such as the Alpha Form Nickel stencil from Cookson Performance Materials, having a corporate headquarters in South Plainfield, N.J., U.S.A. Other stencils, such as for example those made of stainless steel, may also be used. After the A-stage epoxy is applied, a squeegee may be used to ensure full and even coverage of the A-stage epoxy within the aperture of the stencil. After the liquid or paste epoxy is applied, the squeegee may be moved over the surface of the stencil, in contact with the stencil, so that the epoxy is worked into (i.e., forced down into) the apertures of the stencil in an evenly applied layer.

In embodiments, the squeegee may be integrated as part of the print head assembly so that the A-stage epoxy is spread by the squeegee as it is applied by the print head assembly. An example of an integrated print head assembly and squeegee for this use is pump-print squeegee from DEK International. The print head assembly and squeegee may be separate in further embodiments.

In embodiments, the film layer may have a thickness of 150 µm to 250 µm, though it may be thinner or thicker than that, depending in part on the number of die and specifications for the finished semiconductor device, as well as the height of the controller die 114, wire bonds 116 and passive components 112. The film layer 120 may be applied by methods other than printing in further embodiments. Such further examples include thin film deposition techniques, and jet dispensing techniques. In an example, the A-stage film layer 120 may have an initial viscosity of 30,000 cPat 25° C., Brookfield CP51 at 5 rpm, though it is understood that the viscosity of the A-stage liquid may be higher or lower than that in further embodiments.

Figure 8:
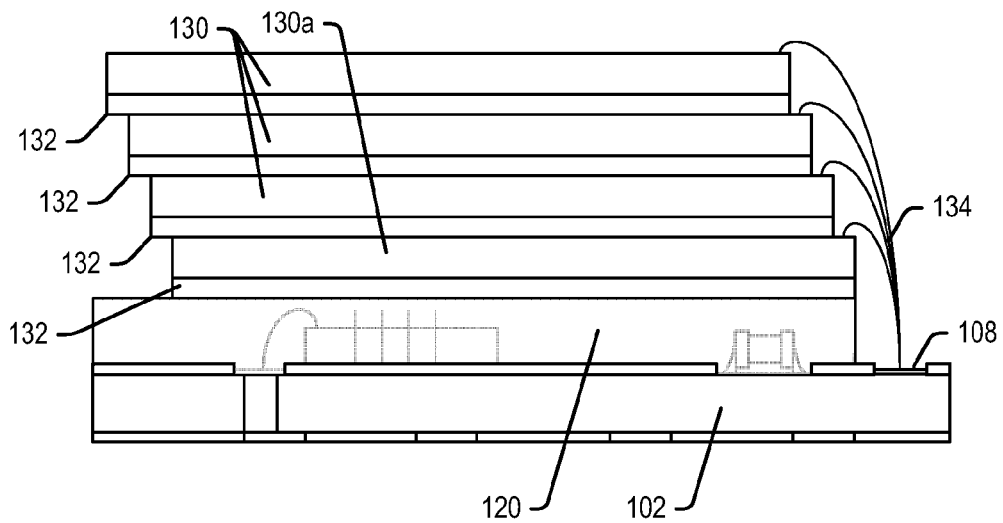
FIG. 8 is a side view of a semiconductor device at a third step in the fabrication process including a die stack mounted to the substrate in an embodiment of the present technology.

In embodiments, after film layer 120 is formed on substrate 102, one or more semiconductor die 130 may be mounted to the substrate 102, on film layer 120, in step 220 and as shown in FIG. 8. The semiconductor die 130 may for example be memory die such a NAND flash memory die, but other types of die 130 may be mounted to the substrate in step 220 in further embodiments. FIG. 8 shows an embodiment where four die 130 are mounted, but there may be more or less semiconductor die 130 in further embodiments.

In embodiments, each of the semiconductor die 130 may include a die attach adhesive 132 on a bottom surface of the die 130 for affixing the die to each other and the film layer 120. Die attach adhesive may be a film for example be between 5 µm and 20 µm thick, though it may be thinner or thicker than that in further embodiments. The die attach adhesive 132 may be applied before or after separation of the die 130 from the wafer. When applied when die 130 are part of a wafer, the die attach adhesive may be applied as a B-stage epoxy in a wafer backside coating process. As one example, the die attach adhesive 132 may be EM-710H-P from Nitto-Denko Corp. having a headquarters in Japan. Another example of die attach adhesive 132 is 8988UV epoxy from Henkel AG & Co. KGaA, cured to a B-stage prior to affixation of the die 130 onto the film layer 120.

Of note, the die attach adhesive on a bottom die 130a is not used to embed the controller 114 or wire bonds 116. As such, the bottom die 130a may also include the same B-stage die attach adhesive 132 as the other semiconductor die. Thus, the die attach adhesive 132 may be applied to each of the semiconductor die 130 (including die 130a) uniformly, for example while the die 130 are still affixed together as part of a semiconductor wafer, and thereafter cured to the B-stage. Moreover, the bottom die 130a may be applied in the same process tool as the remaining die 130. As used herein, a B-stage is an intermediate stage in the reaction of a thermosetting adhesive and/or epoxy in which the material is stable and generally maintains its shape if stored or transported, but which may soften when heated so that it may bond to a surface placed in contact with the adhesive and/or epoxy.

In order to affix the die 130 to the substrate 102, the bottom die 130a is positioned against the substrate 102 so that the die attach adhesive rests against the film layer 120. As noted above, the film layer 120 may be applied to the substrate as an A-stage liquid or paste. In embodiments described below, the film layer 120 may be cured to a B-stage before the bottom die 130a is positioned on the substrate 102. This allows the substrate panel to be stored and/or transported while the film layer 120 remains stable and intact. In another example, the film layer 120 may be cured to a C-stage before the bottom die 130a is positioned on the substrate 102. A C-stage is a final stage in the reaction of a thermosetting adhesive and/or epoxy where the material is solid and insoluble, for example as a result of the molecules in the material having cross-linked with each other. Examples where the film layer 120 is a B-stage epoxy when the die 130a is positioned thereon, and a C-stage epoxy when the die 130a is positioned thereon, are explained in greater detail below.

In the example where the film layer is a B-stage epoxy when the die 130a is positioned thereon, the A-stage film layer 120 may be cured to a B-stage by heating the film layer 120 for 90 minutes at 125° C. Other heating temperatures and times are contemplated. Depending on the material of the film layer 120, the film layer may be cured to a B-stage by ultraviolet irradiation in further embodiments. This B-stage heating step may take place after the A-stage film layer 120 is applied within the stencil and before the stencil is removed. It may take place after the stencil is removed (or where no stencil is used) in further embodiments.

When the bottom die 130a is placed on the B-stage film layer 120, the substrate may be heated to soften the B-stage film layer 120 to promote adhesion between the film layer 120 and the die attach adhesive 132 on the bottom die 130a. The heat applied may cure both the film layer 120 and the die attach adhesive 132 on the lower die 130 to C-stage solids firmly adhered to each other. In one example, after contact with the die attach adhesive 132, the B-stage film layer 120 may be cured to its final C-stage by heating the film layer 120 with a 30 minute ramp up from room temperature to 100° C., plus another 30 minutes at 100° C. In another example, the cure to a C-stage epoxy may take place with a 30 minute ramp up from room temperature to 175° C., plus another 30 minutes at 175° C. Further examples of the cure of the film layer 120 to the C-stage may take place at temperatures anywhere between the above-described ranges.

Figure 9:
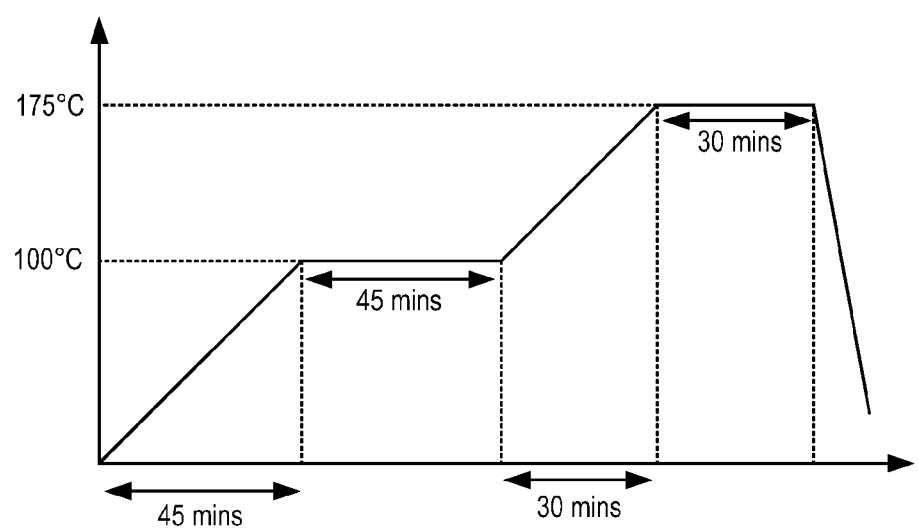
FIG. 9 is a plot showing temperatures and durations for curing a film layer to a final C-stage in an embodiment of the present technology.

Moreover, the cure of the film layer 120 to the C-stage may take place at temperatures and for times above and below the above-described examples in further embodiments. Moreover, a cure of the layer 120 to a C-stage may have multiple heating stages, for example as shown in FIG. 9. Other examples of multiple heating stages are contemplated, where any of the temperatures and time periods shown in FIG. 9 may vary. Depending on the material of the film layer 120, the film layer may be cured to the C-stage ultrasonically in further embodiments.

In an example where the film layer is a C-stage epoxy when the die 130a is positioned thereon, the A-stage film layer 120 may be cured to a B-stage, and subsequently to a C-stage, according to any of the B-stage and C-stage curing methods described above. In a further embodiment, the A-stage film layer 120 may be cured directly to the C-stage. This may also be done by any of the C-stage curing methods described above. Some epoxies are meant to cure from an A-stage directly to a C-stage. These epoxies are referred to herein as A-stageable epoxies. Other epoxies are meant to cure from an A-stage to an intermediate B-stage and then to a C-stage. The epoxies are referred to herein as B-stageable epoxies. In an example where the film layer is a C-stage epoxy when the die 130a is positioned thereon, either A-stageable or B-stageable epoxies may be used. In this embodiment, the final C-stage film layer 120 does not adhere the bottom die 130a to the substrate. The die attach adhesive 132 on the bottom die 130a bonds the die 130a to the solid film layer 120 (in a separate curing step from that which cured the film layer 120 to the C-stage).

After the bottom die 130a is positioned on the film layer 120 as described above, additional die 130 in the die stack may similarly be positioned in the die stack. Thereafter, in step 224, each of the die 130 may be electrically coupled to the substrate by wire bonds 136 formed between die bond pads on the die 130 and the contact pads 108 on the substrate 102 as shown in FIG. 8. While all of the wire bonds are shown extending from a single edge of the memory die 130, it is understood that die 130 may have die bond pads and wire bonds around two or more edges. Moreover, die 130 in the stack may be wire bonded to each other, instead of or in addition to each die 130 wire bonding to the substrate 102.

In embodiments, each die 130 may be wire bonded to the substrate 102 after it is positioned on the substrate. In further embodiments, all die may be positioned on the substrate, and then after that, all die may be wire bonded to the substrate. In embodiments, the die attach adhesive 132 on each die 130 may be cured to bond the die to each other and the substrate after all die are positioned in the die stack, and before or after all die are wire bonded to the substrate. In embodiments where the film layer 120 is a B-stage epoxy when the die 130 are positioned in the die stack, the film layer 120 may be cured to a final C-stage at the same time as the die attach adhesives 132 on each die 130. In further embodiments, the final cure of a B-stage film layer 120 and the die attach adhesives 132 may take place thereafter, for example during the mold encapsulation process, explained below.

Figure 10:
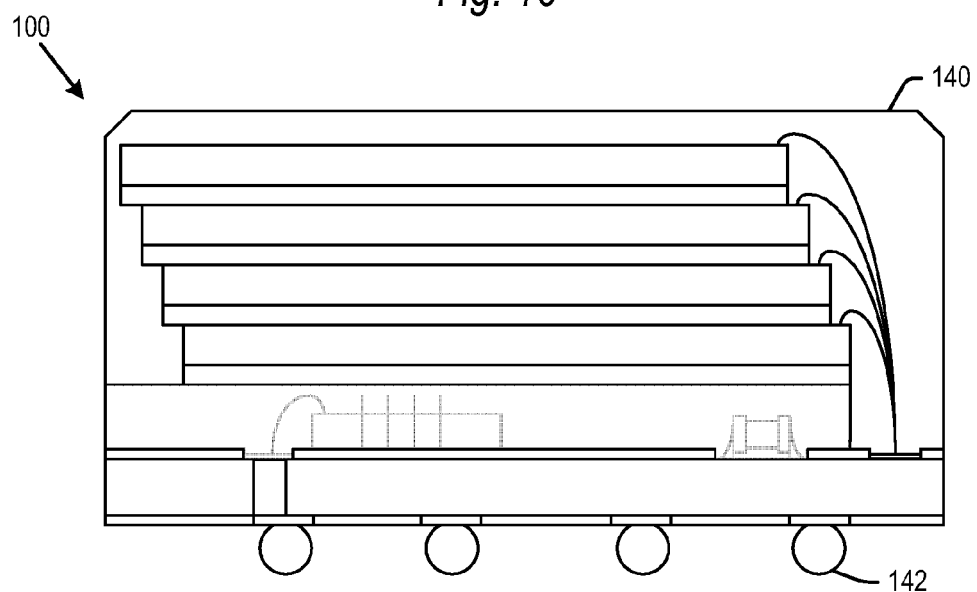
FIG. 10 is a side view of a finished semiconductor device according to an embodiment of the present technology.
Figure 11:
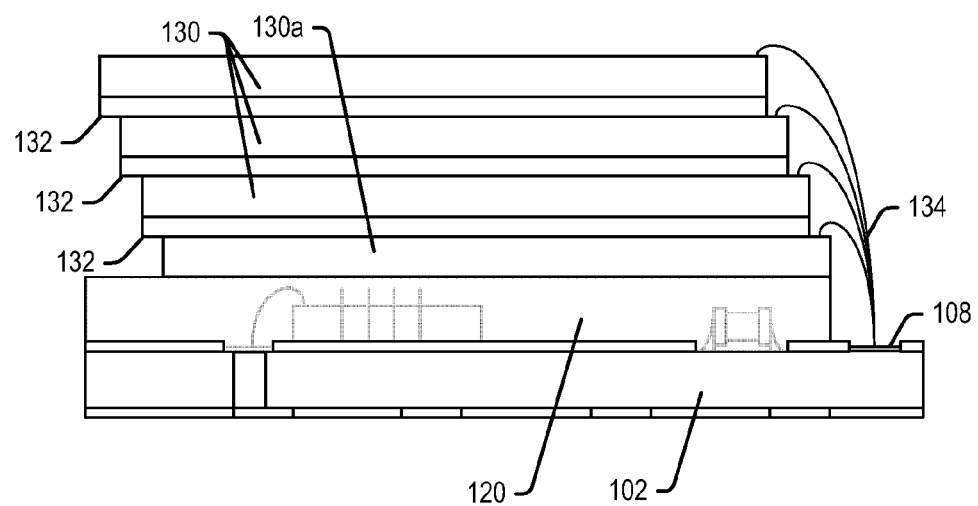
FIG. 11 is a side view of a semiconductor device including a die stack mounted to the substrate in an alternative embodiment of the present technology.
Figure 12:
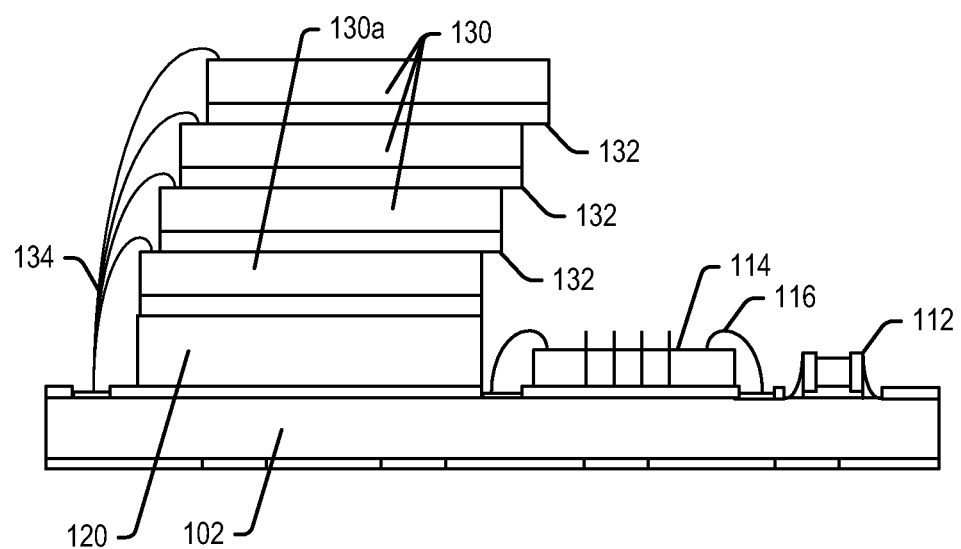
FIG. 12 is a side view of a semiconductor device including a die stack mounted to the substrate in a further alternative embodiment of the present technology.

Following mounting of the die stack and wire bonding, the die stack, wire bond and at least a portion of the substrate may be encapsulated in a mold compound 140 in a step 226 and as shown in FIG. 10. Mold compound 140 may include for example solid epoxy resin, Phenol resin, fused silica, crystalline silica, carbon black and/or metal hydroxide. Such mold compounds are available for example from Sumitomo Corp. and Nitto-Denko Corp., both having headquarters in Japan. Other mold compounds from other manufacturers are contemplated. The mold compound may be applied according to various known processes, including by transfer molding or injection molding techniques. The encapsulation process may be performed by FFT (Flow Free Thin) compression molding in further embodiments.

As shown in FIG. 10, after the die on the panel are encapsulated in step 226, solder balls 142 may be soldered to the contact pads 108 on a bottom surface of the respective packages in step 228 for embodiments where the device is a BGA package. Where the packages are LGA packages, step 226 may be skipped.

The respective packages may be singulated in step 230 from the panel to form the finished semiconductor device 100 shown in FIG. 10. Each semiconductor device 100 may be singulated by any of a variety of cutting methods including sawing, water jet cutting, laser cutting, water guided laser cutting, dry media cutting, and diamond coating wire cutting. While straight line cuts will define generally rectangular or square shaped semiconductor device 100, it is understood that semiconductor device 100 may have shapes other than rectangular and square in further embodiments of the present invention.

Once cut into packages 100, the packages may be tested in a step 232 to determine whether the packages are functioning properly. As is known in the art, such testing may include electrical testing, burn in and other tests. Optionally, in step 234, the finished semiconductor devices may be encased within a lid (not shown), for example where the semiconductor devices are LGA packages.

The finished semiconductor package 100 may for example be a memory card such as for example an MMC card, an SD card, a multiuse card, a micro-SD card, a memory stick, a compact SD card, an ID card, a PCMCIA card, an SSD card, a chip-card, a smartcard, an USB card, an MCP-type embedded card storage, or the like.

In the embodiments described above, the film layer 120 may be cured to a C-stage prior to affixing the memory die, as the bottom die 130a includes a die attach adhesive 132 for mounting the bottom die to the substrate 102. In a further embodiment shown in FIG. 11, the die attach adhesive 132 may be omitted from the bottom die 130a. In such embodiments, the bottom die 130a may be affixed to the substrate 102 using solely the film layer 120. In such an embodiment, the film layer may be cure to a B-stage after formation on the substrate. Thereafter, the die 130a may positioned on the film layer 120, the film layer heated to soften the layer, and the film layer cured to a C-stage as described above so that the film layer 120 bonds the die 130a to the substrate.

In the embodiments described above, the film layer 120 is used to cover surface mounted controller 114 and passive components 112 and support the memory die 130. In a further embodiment shown in FIG. 12, the film layer 120 may support the memory die 130 and be formed according to any of the above-described embodiments (formed to a B-stage or C-stage prior to positioning the die 130 thereon). However, in this embodiment, the controller 114 and/or passive components 112 may be positioned on the substrate outside of the film layer 120. Here, the film layer 120 may act as a spacer to provide room on the substrate, away from the memory die stack, for surface mounting components such as for example the controller die 114.

Figure 13:
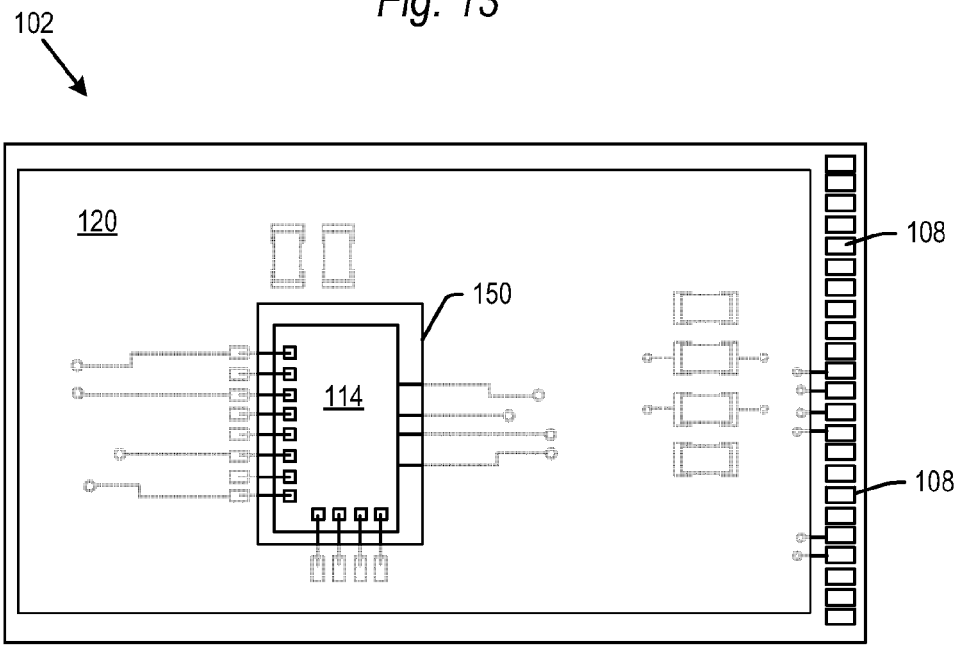
FIGS. 13-16 are alternative configurations of a film layer on the substrate according to further embodiments of the present technology.
Figure 14:
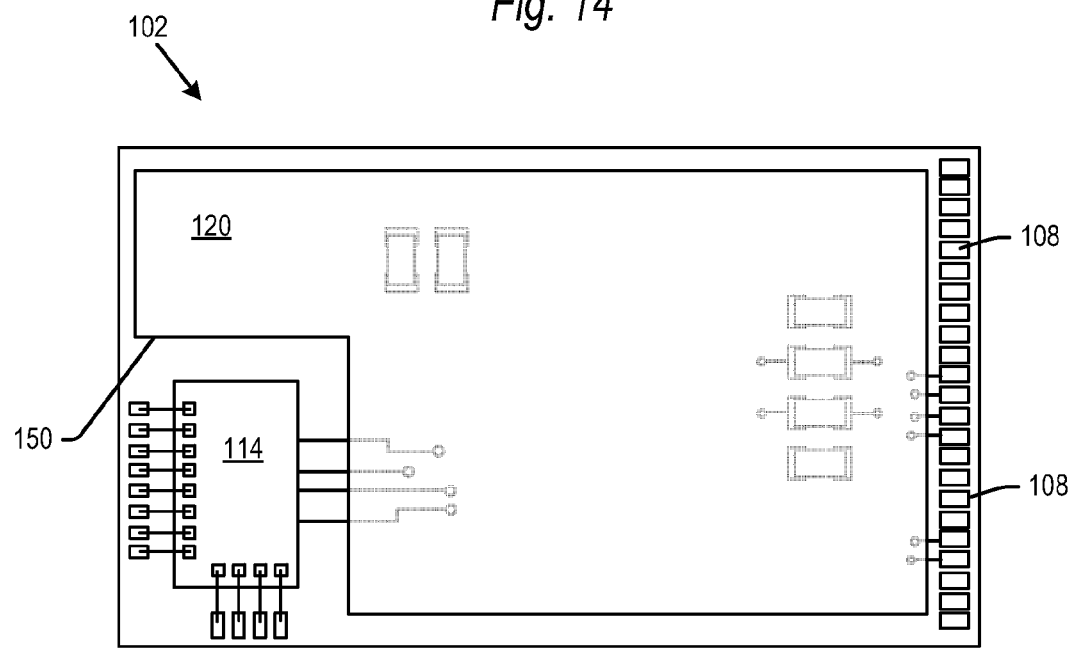
Figure 15:
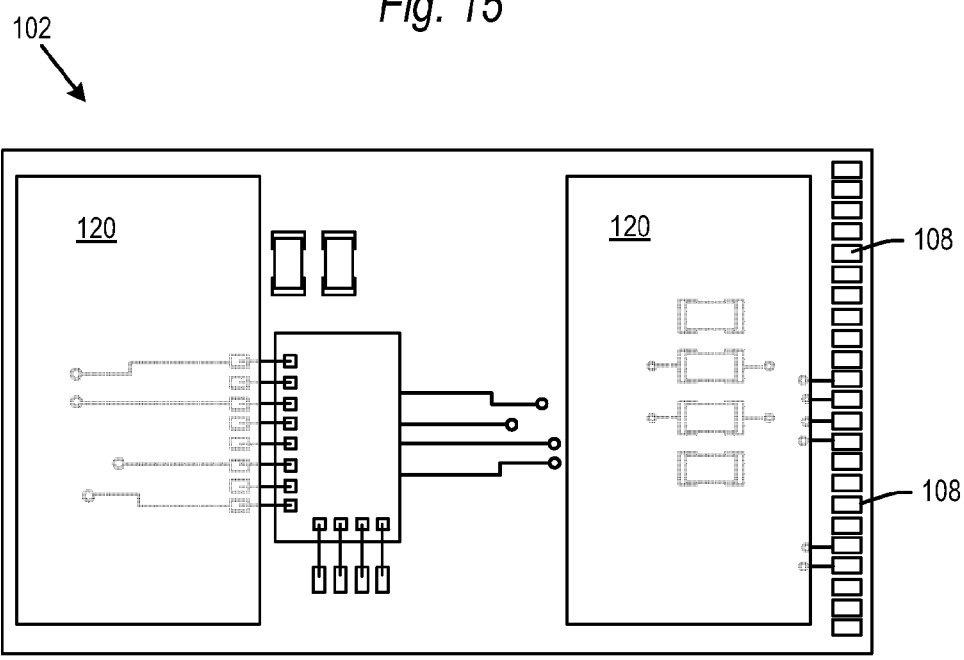
Figure 16:
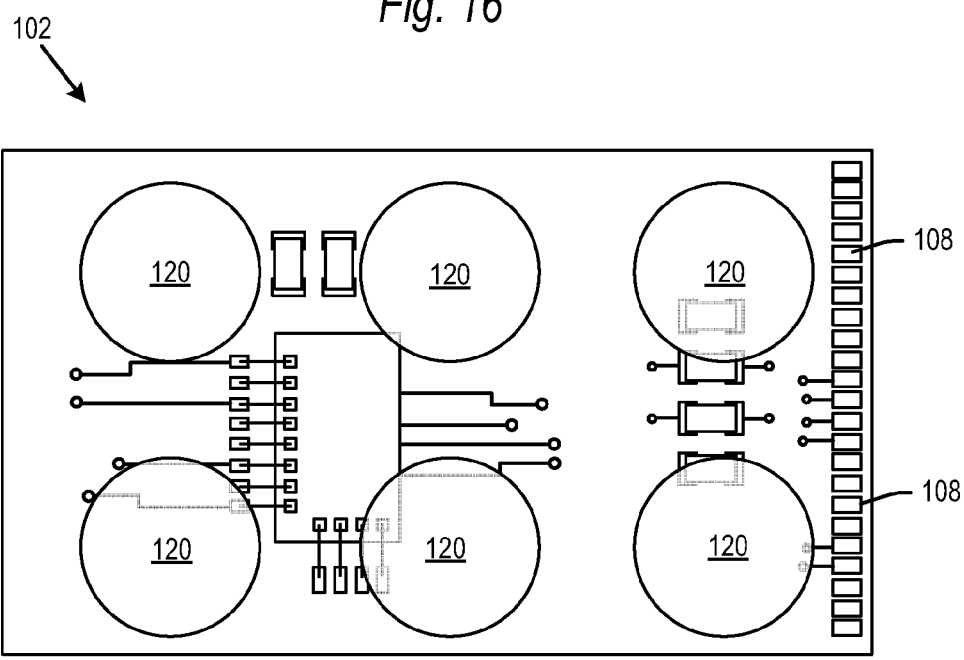

As noted above, in embodiments, the shape and position of the film layer 120 may match that of the bottom die 130a mounted thereon. However, the film layer 120 may be a variety of different shapes in further embodiments. FIGS. 13-16 present a few, non-limiting examples. In FIGS. 13 and 14, film layer 120 is formed with an opening 150, for example over the controller die 114. The opening 150 may be any shape or size, or at any position, within the footprint of the film layer 120. FIGS. 14 and 15 show examples where the film layer is formed in a number of discrete sections. The number, shape, size and positions of the discrete sections on the substrate 102 may vary in further embodiments. These and other configurations of the film layer 120 may be provided by patterning a stencil, described above, with apertures as desired through which the film layer 120 is initially applied as a liquid or paste and thereafter cured.

In summary, in one example, the present technology relates to a semiconductor device, comprising: a substrate; an electronic component surface mounted to the substrate; a film layer formed on the substrate, the electronic component being at least partially embedded within the film layer; and at least one semiconductor die including a semiconductor die having a die attach adhesive affixing the semiconductor die to the film layer.

In a further example, the present technology relates to a semiconductor device, comprising: a substrate; an electronic component surface mounted to the substrate; a film layer formed on the substrate, the film layer spaced from the electronic component on the substrate; and at least one semiconductor die including a semiconductor die having a die attach adhesive affixing the semiconductor die to the film layer.

In another example, the present technology relates to a method of forming a semiconductor device, comprising the steps of: (a) mounting an electronic component on a substrate; (b) applying a film layer to the substrate, the electronic component being at least partially embedded within the film layer; (c) curing the film layer to at least a B-stage after the electronic component is at least partially embedded in the film layer in said step (b); (d) positioning a semiconductor die on the film layer; and (e) affixing the semiconductor die to the film layer.

In a further example, the present technology relates to a method of forming a semiconductor device, comprising the steps of: (a) mounting a controller die on a substrate; (b) applying an A-stage film layer to the substrate, the controller die being at least partially embedded within the film layer; (c) curing the film layer to a C-stage after the electronic component is at least partially embedded in the film layer in said step (b); (d) positioning a semiconductor die on the film layer, the semiconductor die including a die attach adhesive on a surface of the semiconductor die between the semiconductor die and the film layer; and (e) affixing the semiconductor die to the film layer by curing the die attach adhesive layer.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
    a substrate;
    a controller die surface mounted to the substrate;
    a film layer formed on the substrate, the film layer lying next to the controller die on the substrate, on one or more sides of the controller die; and
    at least one semiconductor die including a semiconductor die having a die attach adhesive affixing the semiconductor die to the film layer.

2. The semiconductor device of claim 1, wherein the at least one semiconductor die comprises at least one memory die.

3. The semiconductor device of claim 1, further comprising wire bonds electrically coupling the electronic component to the substrate, the wire bonds embedded in the film layer.

4. The semiconductor device of claim 1, wherein the semiconductor device is a flash memory package.

5. The semiconductor device of claim 1, wherein the film layer is a B-stageable epoxy.

6. The semiconductor device of claim 1, wherein the film layer is an A-stageable epoxy.

7. A semiconductor device, comprising:
    a substrate;
    an electronic component surface mounted to the substrate;
    a B-stageable epoxy film layer formed on the substrate, the film layer spaced from the electronic component on the substrate; and at least one semiconductor die including a semiconductor die having a die attach adhesive affixing the semiconductor die to the film layer.

8. The semiconductor device of claim 7, wherein the film layer is formed on the substrate in a shape and position matching a shape and position the semiconductor die on the substrate.

9. The semiconductor device of claim 7, wherein the electronic component is one of a controller die and a passive component.

10. A semiconductor device, comprising:
a substrate;
a first semiconductor die surface mounted to the substrate, the first semiconductor die being a controller die;
a film layer formed on the substrate, the first semiconductor die being at least partially embedded within the film layer; and
at least one second semiconductor die including a semiconductor die affixed directly to the film layer.

11. The semiconductor device of claim 10, wherein the film layer is a B-stageable epoxy.

12. The semiconductor device of claim 10, wherein the film layer is an A-stageable epoxy.

13. The semiconductor device of claim 10, wherein the film layer is formed on the substrate in a shape and position matching a shape and position the semiconductor die on the substrate.

14. A semiconductor device, comprising:
a substrate;
an electronic component surface mounted to the substrate;
a film layer formed on the substrate, the film layer lying next to the electronic component on the substrate, on one or more sides of the electronic component;
wire bonds electrically coupling the electronic component to the substrate, the wire bonds embedded in the film layer; and
at least one semiconductor die including a semiconductor die having a die attach adhesive affixing the semiconductor die to the film layer.

15. The semiconductor device of claim 14, wherein the electronic component is a controller die.

16. The semiconductor device of claim 14, wherein the electronic component is a passive component.

17. The semiconductor device of claim 14, wherein the at least one semiconductor die comprises at least one memory die.

18. The semiconductor device of claim 14, wherein the semiconductor device is a flash memory package.

19. The semiconductor device of claim 14, wherein the film layer is a B-stageable epoxy.

20. The semiconductor device of claim 14, wherein the film layer is an A-stageable epoxy.

* * * * *

UNITED STATES PATENT AND TRADEMARK OFFICE
CERTIFICATE OF CORRECTION

PATENT NO. : 9,773,766 B2  
APPLICATION NO. : 14/422152  
DATED : September 26, 2017  
INVENTOR(S) : Ye et al.

Page 1 of 1

It is certified that error appears in the above-identified patent and that said Letters Patent is hereby corrected as shown below:

On the Title Page

Other Publications, Column 2, Line 1, please change "in Tawian" to -- in Taiwan --

In the Claims

Column 11, Line 6 (Claim 8, Line 3) please change "position the" to -- position of the --

Column 11, Line 26 (Claim 13, Line 3) please change "position the" to -- position of the --

Signed and Sealed this  
Nineteenth Day of December, 2017

Joseph Matal  
*Performing the Functions and Duties of the*  
*Under Secretary of Commerce for Intellectual Property and*  
*Director of the United States Patent and Trademark Office*